United States Patent [19]

Kim

[11] Patent Number: 5,397,742
[45] Date of Patent: Mar. 14, 1995

[54] METHOD FOR FORMING TUNGSTEN PLUG FOR METAL WIRING

[75] Inventor: Choon H. Kim, Bubaleub, Rep. of Korea

[73] Assignee: Hyundai Electronics Industries Co., Ltd., Rep. of Korea

[21] Appl. No.: 228,109

[22] Filed: Apr. 15, 1994

[30] Foreign Application Priority Data

Apr. 16, 1993 [KR] Rep. of Korea .................. 1993-6464

[51] Int. Cl.$^6$ ................. H01L 21/205; H01L 21/3205
[52] U.S. Cl. .................... 437/190; 437/188; 437/192; 437/200; 156/634; 156/664
[58] Field of Search ................. 156/634, 664; 437/187, 437/188, 190, 192, 200

[56] References Cited

U.S. PATENT DOCUMENTS

| | | | |
|---|---|---|---|
| 4,782,380 | 11/1988 | Shankar et al. | 357/71 |
| 4,884,123 | 11/1989 | Dixit et al. | 357/71 |
| 4,994,410 | 2/1991 | Sun et al. | 437/192 |
| 5,162,262 | 11/1992 | Ajika et al. | 437/200 |
| 5,240,888 | 8/1993 | Hindman et al. | 437/190 |
| 5,242,860 | 9/1993 | Nulman et al. | 437/190 |
| 5,312,772 | 5/1994 | Yokoyama et al. | 437/190 |

FOREIGN PATENT DOCUMENTS

| | | |
|---|---|---|
| 03011732 | 1/1991 | Japan . |
| 05013600 | 1/1993 | Japan . |
| 05629316 | 2/1993 | Japan . |
| 05243179 | 9/1993 | Japan . |

OTHER PUBLICATIONS

Fujimura et al., "Solid Phase Reactions and Change in Stress of Tin/Ti/Si for a Diffusion Barrier", J. Appl. Phys. 67(6) 15 Mar. 1990, p. 2899–2903.

Primary Examiner—Olik Chaudhuri
Assistant Examiner—Ken Horton
Attorney, Agent, or Firm—Merchant, Gould, Smith, Edell, Welter & Schmidt

[57] ABSTRACT

A method for forming a tungsten plug for wiring metal comprises the steps of: forming a first Ti film and a TiN film on the entire surface of an insulating film at respective thickness, in due order, the insulating film having been etched to form a contact hole therein; forming a TiSi$_2$ film over the TiN film; forming a blanket tungsten film over the TiSi film; applying etch back to the tungsten film, to form a tungsten plug in the contact hole, the TiSi$_2$ film being partially covered with tungsten residues and partially exposed; and etching the TiSi$_2$ film with a solution having different chemical etching powers to the TiSi$_2$ film and the TiN film, the tungsten residues being removed as the TiSi$_2$ film is etched. The method is capable of completely removing the tungsten residues which are formed when the blanket tungsten film is subjected to etch back to form the plug for metal wiring and thus, capable of preventing the damage of the plug tungsten and the TiN film. Consequently, there is effected the improvement of semiconductor device reliability and production yield.

3 Claims, 4 Drawing Sheets

METHOD FOR FORMING TUNGSTEN PLUG FOR METAL WIRING

BACKGROUND OF THE INVENTION

1. Field of the Invention

The present invention relates, in general, to a construction method for the metal wiring of semiconductor device and, more particularly, to a method for forming a tungsten plug on a contact hole.

2. Description of the Prior Art

A blanket tungsten chemical vapor deposition (blanket-W CVD) for the formation of tungsten plug for metal wiring, which is to deposit tungsten entirely over a substrate, generally comprises a glue layer deposition process and an etch back process for the tungsten film entirely deposited. The tungsten etch back process is carried out by a plasma etch, a dry etch.

When the plasma etch back for the plug formation is carried out, there is often generated an imperfection, which leaves on a region some tungsten which must be removed by etch. In turn, these tungsten residues cause the bridge and short of a metal layer.

In order to prevent the formation of the tungsten residues, the etch back may be overly performed. However, this over etch causes the excess removal of the tungsten from a contact plug and has a key hole formed on the center of the contact hole, so that the metal wiring formed comes to be poor in reliability.

SUMMARY OF THE INVENTION

Therefore, an object of the present invention is to overcome the above problems encountered in the prior art and to provide a method for forming a tungsten plug for metal wiring, capable of removing the tungsten residue and preventing damage by an etch process employing a buffered oxide etchant (hereinafter, referred to as "BOE").

In accordance with the present invention, the above object can be accomplished by providing a method for forming a tungsten plug for wiring metal, comprising the steps of: forming a first Ti film and a TiN film on the entire surface of an insulating film at respective thickness, in due order, the insulating film having been etched to form a contact hole therein; forming a $TiSi_2$ film over the TiN film; forming a blanket tungsten film over the TiSi film; applying etch back to the tungsten film, to form a tungsten plug in the contact hole, the $TiSi_2$ film being partially covered with tungsten residues and partially exposed; and etching the $TiSi_2$ film with a solution having different chemical etching powers to the $TiSi_2$ film and the TiN film, the tungsten residues being removed as the $TiSi_2$ film is etched.

BRIEF DESCRIPTION OF THE DRAWING

The above object and other advantages of the present invention will become more apparent by describing in detail the preferred embodiment of the present invention with reference to the attached drawings in which.

DETAILED DESCRIPTION OF THE PREFERRED EMBODIMENT

Figure 1A:
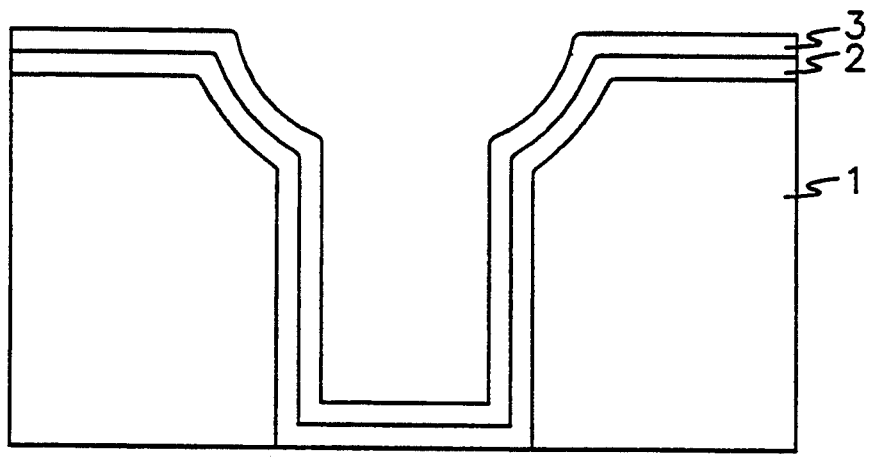
FIGS. 1A through 1G are schematic, cross-sectional views illustrating a method for the formation of metal wiring, according to the present invention.

Hereinafter, the preferred embodiment of the present invention will be, in detail, described with reference to the accompanying drawings, wherein like reference numerals designate like parts, respectively.

First, over an oxide film 1 in which a contact hole is formed by etching the oxide film 1, as shown in FIG. 1A, a first Ti film 2 and a TiN film 3 which serve as barrier metals for the improvement of the resistance characteristics of junction are formed at respective predetermined thickness, in due order.

Figure 1B:
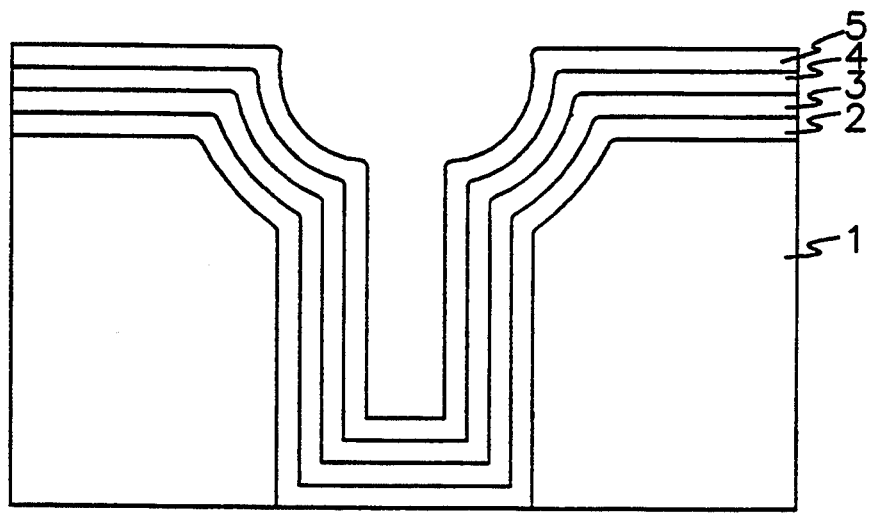

Next, in order to form a $TiSi_2$ film on the TiN film 3, a second Ti film 4 and a polysilicon film 5 are deposited in due order, as shown in FIG. 1B.

Figure 1C:
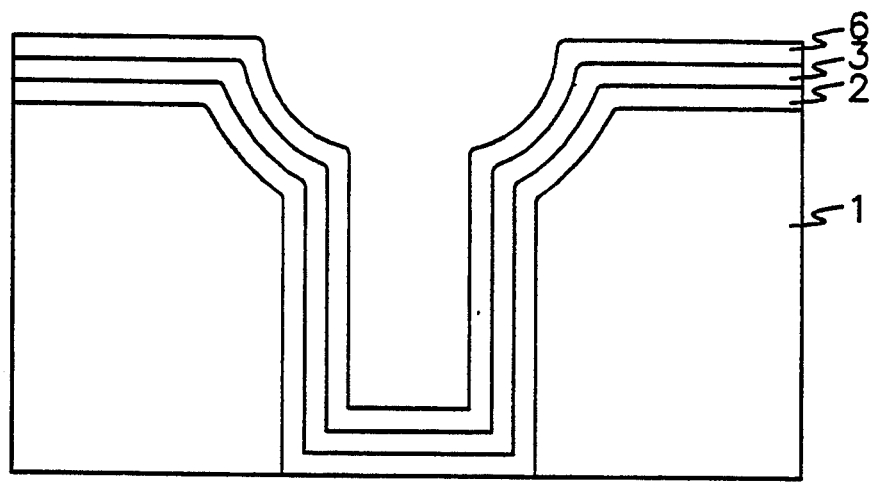

A rapid thermal process (hereinafter, referred to as "RTP") is undertaken at 700° to 800° C., so as to turn the second Ti film 4 and the polysilicon film 5 into a $TiSi_2$ film 6, as shown in FIG. 1C.

Figure 1D:
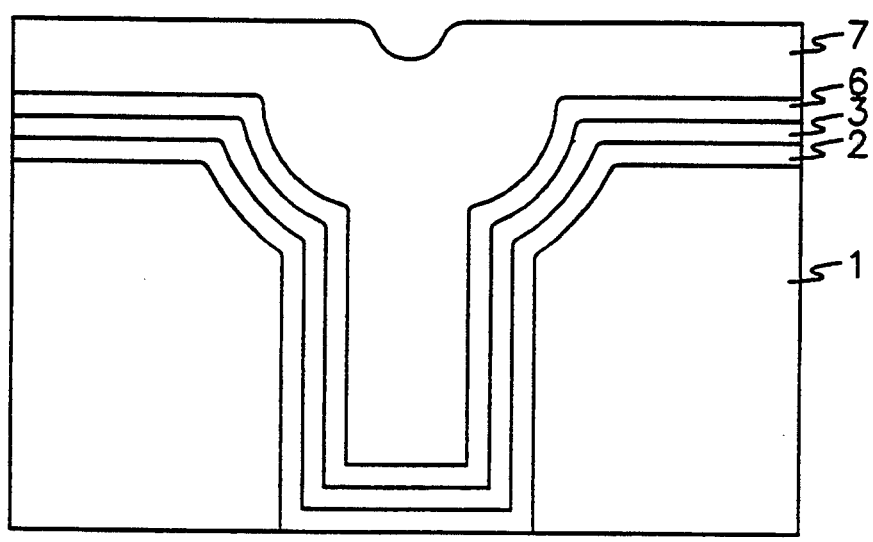

Subsequently, over the $TiSi_2$ film 6 which plays a role of a junction layer, a tungsten film 7 is entirely formed at 350° to 450° C., as shown in FIG. 1D.

Figure 1E:
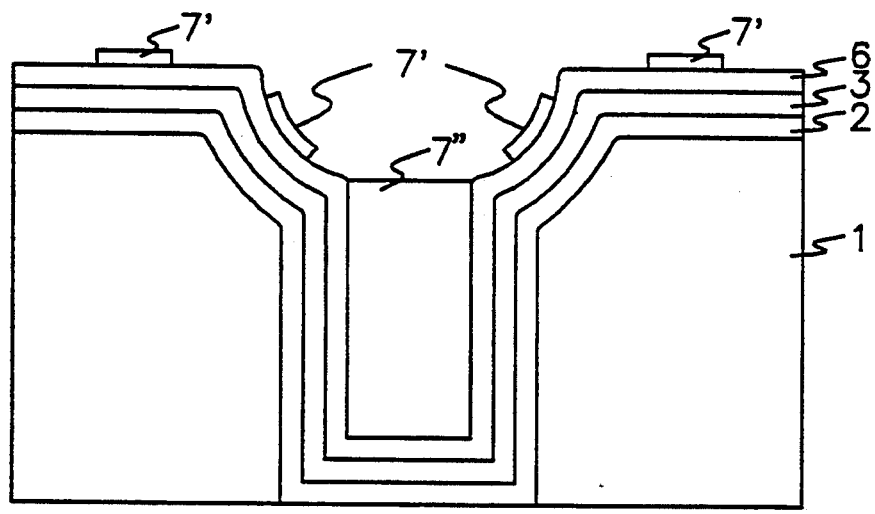

Thereafter, the tungsten film 7 is subjected to etch back by applying a dry plasma etch process, so as to form tungsten plug 7" on a predetermined portion and leave tungsten residues 7' on the $TiSi_2$ film 6 other than the plug, as shown in FIG. 1E.

Figure 1F:
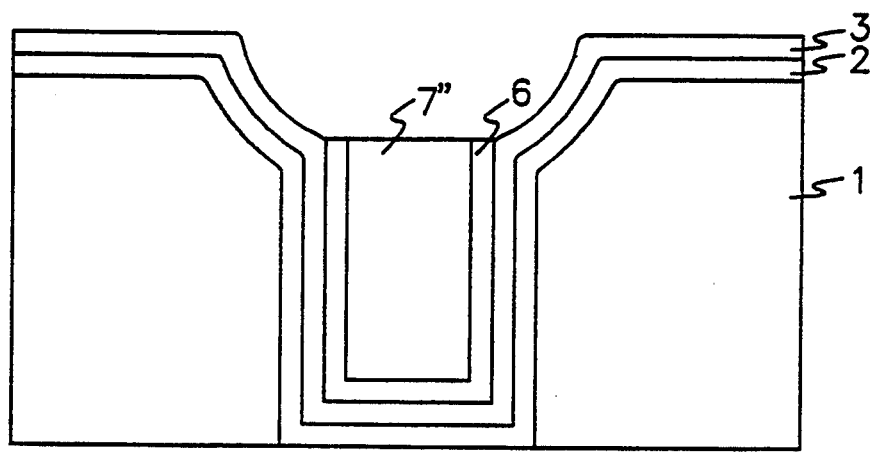

Following this, a BOE consisting of, for instance, $NH_4F$ and HF which is a kind of a wet etching solution, as shown in FIG. 1F, is used to etch the $TiSi_2$ film 6. As the $TiSi_2$ is etched, the tungsten residues formed thereon are removed, as well. At this time, since the BOE solution is able to remove the $TiSi_2$ film 6 but not able to etch the TiN film 3 and the tungsten plug 7", it is prevented that the tungsten plug 7" in the contact hole and the TiN film 3 is overly etched. In the meanwhile, the TiN film 3 also serves as a barrier preventing the insulating film from being etched by the BOE.

Figure 1G:
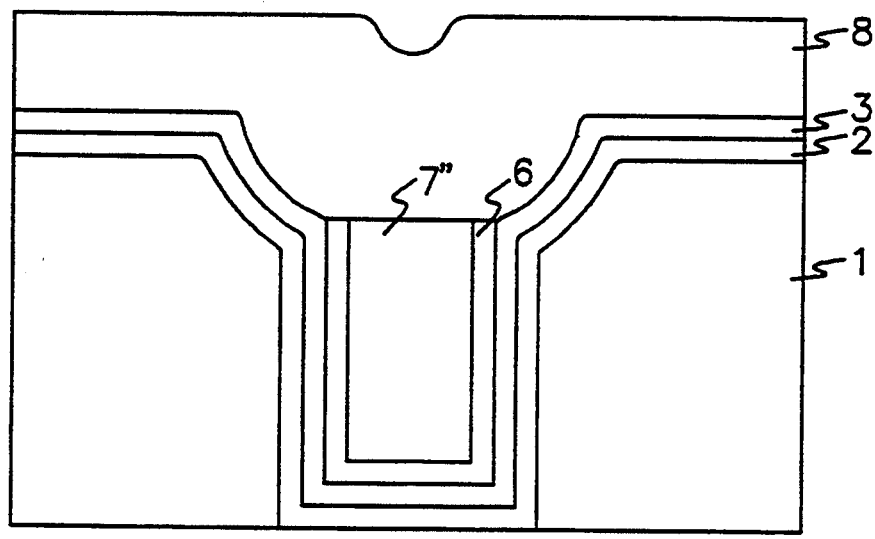

Finally, an aluminum layer 8 is entirely deposited on the resulting structure, as shown in FIG. 1G.

As described hereinbefore, the method according to the present invention is capable of completely removing the tungsten residues which are formed when the blanket tungsten film is subjected to etch back to form the plug for metal wiring and thus, capable of preventing the damage of the plug tungsten and the TiN film. Accordingly, the present invention effects the improvement of semiconductor device reliability and production yield.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for forming a tungsten plug for wiring metal, comprising the steps of:
   forming a first Ti film and a TiN film on the entire surface of an insulating film at respective thickness, in due order, said insulating film having been etched to form a contact hole therein;
   forming a $TiSi_2$ film over said TiN film;
   forming a blanket tungsten film over said $TiSi_2$ film;
   applying etch back to said tungsten film, to form a tungsten plug in said contact hole, said $TiSi_2$ film being partially covered with tungsten residues and partially exposed; and etching said TiSi$_2$ film with a solution having different etching selectivities to said TiSi$_2$ film and said TiN film, said tungsten residues being removed as said TiSi$_2$ film is etched.

2. A method according to claim 1, wherein said solution is a buffered oxide etchant.

3. A method according to claim 1, wherein said TiSi$_2$ film is formed by forming a Ti film and a polysilicon film over said TiN film, in due order and carrying out a rapid thermal process.

* * * * *